United States Patent
Li et al.

(10) Patent No.: US 8,299,562 B2
(45) Date of Patent: Oct. 30, 2012

(54) ISOLATION STRUCTURE AND DEVICE STRUCTURE INCLUDING THE SAME

(75) Inventors: Chung-Ren Li, Hsinchu County (TW); Shing-Hwa Renn, Taipei (TW); Yu-Teh Chiang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/072,780

(22) Filed: Mar. 28, 2011

(65) Prior Publication Data

US 2012/0248518 A1    Oct. 4, 2012

(51) Int. Cl.
*H01L 21/70* (2006.01)
(52) U.S. Cl. ................. 257/499; 257/E29.062
(58) Field of Classification Search ............ 257/296, 257/301, 330; 259/397, 499, E29.262
See application file for complete search history.

(56) References Cited

U.S. PATENT DOCUMENTS

| 4,910,709 A * | 3/1990 | Dhong et al. ............ 365/149 |
| 6,906,372 B2 * | 6/2005 | Yamada et al. ........... 257/301 |
| 2011/0227145 A1 * | 9/2011 | Renn ...................... 257/328 |

* cited by examiner

*Primary Examiner* — A. Sefer
*Assistant Examiner* — Nikolay Yushin
(74) *Attorney, Agent, or Firm* — Jianq Chyun IP Office

(57) ABSTRACT

An isolation structure is described, including a doped semiconductor layer disposed in a trench in a semiconductor substrate and having the same conductivity type as the substrate, gate dielectric between the doped semiconductor layer and the substrate, and a diffusion region in the substrate formed by dopant diffusion through the gate dielectric from the doped semiconductor layer. A device structure is also described, including the isolation structure and a vertical transistor in the substrate beside the isolation structure. The vertical transistor includes a first S/D region beside the diffusion region and a second S/D region over the first S/D region both having a conductivity type different from that of the doped semiconductor layer.

19 Claims, 2 Drawing Sheets

ISOLATION STRUCTURE AND DEVICE STRUCTURE INCLUDING THE SAME

BACKGROUND OF THE INVENTION

1. Field of Invention

This invention relates to an isolation structure and a device structure including the isolation structure, wherein the device structure may be a memory structure applied to a volatile or non-volatile memory apparatus.

2. Description of Related Art

A typical memory array, such as a DRAM or flash memory array, includes word lines and bit lines crossing the word lines, and may utilize vertical MOS transistors to achieve $4F^2$ cells. For the $4F^2$ cell of the next generation, the design of buried bit lines is important at least because of the simplified MOL (middle of line) process.

FIG. 1 illustrates a vertical-sectional view (a) and a transverse-sectional view (b) of the structure of a buried bit line and a corresponding vertical transistor in the prior art, wherein the sectional line A-A'/B-B' corresponds to the part (a)/(b) of FIG. 1.

The buried bit line 102 includes a metallic layer 104 and a doped poly-Si layer 106 thereon in a trench 108 in a semiconductor substrate 100. The metallic layer 104 is separated from the substrate 100 by a dielectric layer 110, and a diffusion region 112 is formed in the substrate 100 beside the poly-Si layer 106 to serve as a source/drain (S/D) region. The trench 108 is formed between two conventional isolation structures 114 each including an insulator only, and filled up by an insulating material 116. Word lines 118 are disposed over the buried bit line 102 and separated from the channel region 100a of the vertical transistor by gate dielectric 120. The other S/D 122 of the vertical transistor is disposed over the channel region 100a. In the case of DRAM, the S/D region 122 is coupled to a capacitor (not shown).

For the diffusion region 112 is close to the isolation structure 114, the depletion region 140 thereof reaches to the border of the isolation structure 114 so that the channel region 100a becomes a floating body and the holes generated in the operation cannot be evacuated. Such floating body effect causes undesirable leakage current and greatly degrades the retention capability of the DRAM cell.

SUMMARY OF THE INVENTION

Accordingly, this invention provides an isolation structure that has an isolation effect and is also capable of preventing a floating body effect as being used to isolate a vertical transistor.

This invention also provides a device structure including the isolation structure of this invention.

The isolation structure of this invention includes a doped semiconductor layer disposed in a trench in a semiconductor substrate and having the same conductivity type as the substrate, gate dielectric between the doped semiconductor layer and the substrate, and a diffusion region in the substrate formed by the dopant diffusion through the gate dielectric from the doped semiconductor layer.

In an embodiment, the isolation structure further includes a metallic layer in the trench and under the doped semiconductor layer, and the gate dielectric is also between the metallic layer and the substrate. The conductivity type of the doped semiconductor layer and the substrate may be p-type, or n-type.

The device structure of this invention includes the above isolation structure of this invention and a vertical transistor in the substrate beside the isolation structure. The transistor includes a first S/D region beside the diffusion region in the isolation structure and a second S/D region over the first S/D region both having a conductivity type different from that of the doped semiconductor layer in the isolation structure.

In an embodiment, the first S/D region contacts a buried bit line in another trench in the substrate. The buried bit line may include another metallic layer and another doped semiconductor layer with the conductivity type of the S/D regions thereon. The $1^{st}$ S/D may be formed by dopant diffusion from the another doped semiconductor layer.

Because a diffusion region having a first conductivity type and a higher dopant concentration than the substrate is disposed besides the first S/D region with a second conductivity type, and a higher dopant concentration causes a narrower depletion region, a channel of the first conductivity type is provided between the first S/D region and the isolation trench. Thus, when the transistor is of n-type and the first conductivity type is p-type, for example, the holes generated in the device operation can be evacuated to prevent a floating body effect.

In order to make the aforementioned and other objects, features and advantages of this invention comprehensible, a preferred embodiment accompanied with figures is described in detail below.

DESCRIPTION OF EMBODIMENTS

This invention is further explained by means of the following embodiment and the accompanying drawing, which are not intended to limit the scope of this invention. For example, although the device structure is a DRAM structure in this embodiment, it may alternatively be other type of memory structure, such as flash memory, or a non-memory structure that requires an isolation structure.

Figure 2:
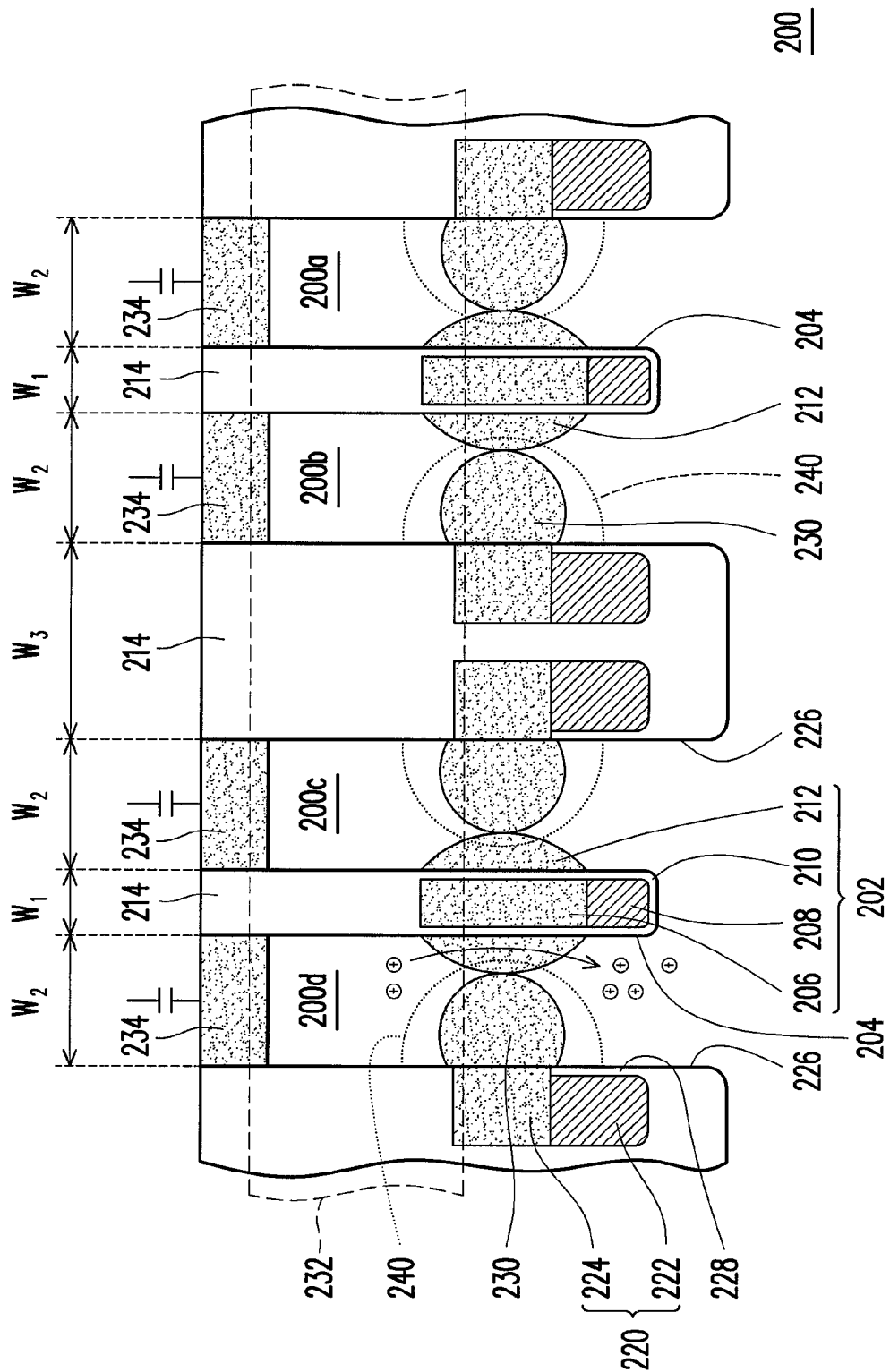
FIG. 2 illustrates a vertical-sectional view of an isolation structure and a device structure including the same according to an embodiment of this invention.

FIG. 2 illustrates a vertical-sectional view of an isolation structure and a device structure including the same according to an embodiment of this invention.

Referring to FIG. 2, the isolation structure 202 is disposed in a semiconductor substrate 200 having a trench 204 therein, including a doped semiconductor layer 206 and a metallic layer 208 under the same in the trench 204, gate dielectric 210 in the trench 204, and a diffusion region 212 in the substrate 200. The metallic layer 208 and the doped semiconductor layer 206 thereon are separated from the substrate 200 by the gate dielectric 210. The doped semiconductor layer 206 has the same conductivity type as the substrate 200. The diffusion region 212 is formed by the dopant diffusion through the gate dielectric 210 from the doped semiconductor layer 206, thus having the same conductivity type of the doped semiconductor layer 206 and the substrate 200. The trench 204 is usually filled up by an insulating material 214, such as CVD $SiO_2$.

The substrate 200 may be a single-crystal silicon substrate. The metallic layer 208 may include titanium nitride (TiN), or tantalum nitride (TaN). The gate dielectric 210 may include silicon dioxide ($SiO_2$). When the transistor to be isolated is of n-type, the conductivity type of the substrate 200 and the doped semiconductor layer 206 in the isolation structure 202 is p-type, wherein the p-type dopant may be boron. When the transistor to be isolated is of p-type, the conductivity type of the substrate 200 and the doped semiconductor layer 206 in the isolation structure 202 is n-type.

Referring to FIG. 2 again, the device structure according to the embodiment may be a memory device like a DRAM device, including a plurality of the above-described isolation structures 202 and a plurality of vertical transistors, wherein a pair of vertical transistors is separated by one isolation structure 202, as described later.

Figure 1:
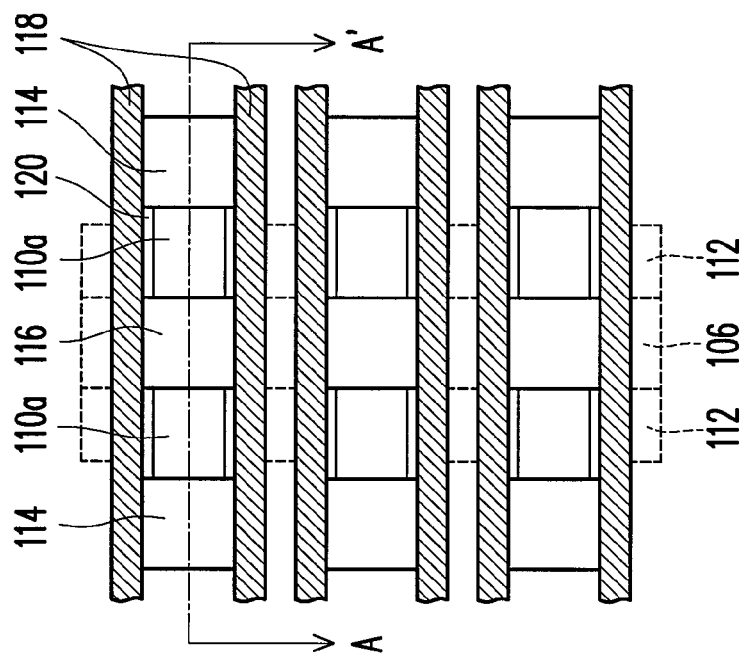
FIG. 1 illustrates a vertical-sectional view (a) and a transverse-sectional view (b) of the structure of a buried bit line and a corresponding vertical transistor in the prior art, wherein the sectional line A-A'/B-B' corresponds to the part (a)/(b) of FIG. 1.
Figure 1:
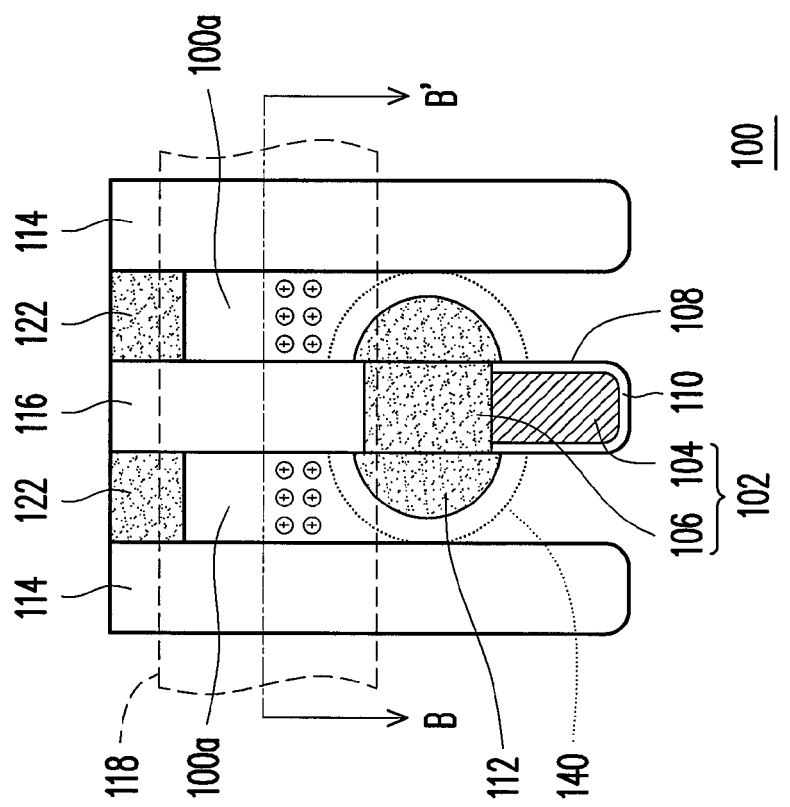

A buried bit line 220 coupled to a vertical transistor includes a metallic layer 222 and a doped semiconductor layer 224 thereon in a trench 226 in the semiconductor substrate 200. The metallic layer 222 is separated from the substrate 200 by a dielectric layer 228, which may have the same material as the gate dielectric 210. A diffusion region 230 is formed in the substrate 200 beside the doped semiconductor layer 224 due to the dopant diffusion from the same. The doped semiconductor layer 224 may include doped poly-Si, of which the conductivity type is different from that of the substrate 200 and the doped semiconductor layer 206 and the diffusion region 212 in the isolation structure 202. A word line 232 is disposed crossing over the buried bit lines 220, possibly having a top view similar to that of a word line 118 shown in FIG. 1.

In FIG. 2, a vertical transistor includes a portion of the diffusion region 230 as a first S/D region, a channel region 200*a* (or 200*b*, 200*c* or 200*d*, referred to as 200*a/b/c/d* hereafter) over the portion of the diffusion region 230, a second S/D region 234 on the channel region 200*a/b/c/d*, a portion of the word line 232 beside the channel region 200*a/b/c/d*, and a gate dielectric layer (not shown) between the portion of the word line 232 and the channel region 200*a/b/c/d*. The arrangement of the word line 232, the gate dielectric layer and the channel region 200*a/b/c/d* may be similar to that shown in FIG. 1 wherein a word line 118 is separated from a channel 100*a* by the gate dielectric 120.

When the above device structure is a DRAM structure, each vertical transistor as a pass transistor of a memory cell is coupled to a capacitor from the second S/D region 234. The capacitor may be a crown capacitor, of which the structure is not illustrated in details here as being well known to those of ordinary skill in the art.

In the embodiment illustrated, two buried bit lines 220 are disposed in one trench 226 in the substrate 200. However, in other embodiments, it is also feasible to form narrower trenches and dispose only one buried bit line in each trench.

In an embodiment, the width $W_1$ of a trench 204 of an isolation structure 202 is (½)F, the width $W_2$ of a channel region 200*a/b/c/d* or a second S/D region 234 is 1F, and the width $W_3$ of a trench 226 for forming two buried bit lines 220 is (3/2)F, so that each memory cell takes an area of $4F^2$ $\{=[(½)F/2+1F+(3/2)F/2]\times 2F\}$. Please refer to FIG. 1(*b*) for the dimension "2F" of one cell in the direction perpendicular to the paper.

In a memory cell of this embodiment, a p- or n-doped diffusion region 212 with a higher dopant concentration than the p⁻- or n⁻-doped substrate 200 is disposed besides the n⁺- or p⁺-doped first S/D region 230. Since a higher dopant concentration causes a narrower depletion region 240, a p- or n-doped channel is provided between the first S/D region 230 and the isolation trench 204. Thus, when the transistor is of n-type and the diffusion region 212 is p-type, for example, the holes generated in the device operation can be evacuated to prevent a floating body effect, as shown in FIG. 2 (see the channel region 200*d*).

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An isolation structure, comprising:
   a doped semiconductor layer in a trench in a semiconductor substrate, having the same conductivity type as the substrate;
   gate dielectric between the doped semiconductor layer and the substrate; and
   a diffusion region disposed besides a source/drain (S/D) region in the substrate, formed by dopant diffusion through the gate dielectric from the doped semiconductor layer, wherein the diffusion region has a first conductivity type and the source/drain region has a second conductivity type.

2. The isolation structure of claim 1, wherein the first conductivity type is p-type and the second conductivity type is n-type.

3. The isolation structure of claim 1, wherein the first conductivity type is n-type and the second conductivity type is p-type.

4. The isolation structure of claim 1, wherein the doped semiconductor layer comprises doped poly-Si.

5. The isolation structure of claim 1, further comprising a metallic layer in the trench and under the doped semiconductor layer, wherein the gate dielectric is also between the metallic layer and the substrate.

6. The isolation structure of claim 5, wherein the metallic layer comprises titanium nitride (TiN) or tantalum nitride (TaN).

7. A device structure, comprising:
   a semiconductor substrate having a first conductivity type;
   an isolation structure, including a first doped semiconductor layer having the first conductivity type in a first trench in the substrate, gate dielectric between the first doped semiconductor layer and the substrate, and a diffusion region in the substrate formed by dopant diffusion through the gate dielectric from the first doped semiconductor layer;
   a first vertical transistor in the substrate at a first side of the isolation structure, including a first source/drain (S/D) region beside the diffusion region and a second source/drain (S/D) region over the first S/D region both having a second conductivity type.

8. The device structure of claim 7, wherein the isolation structure further includes a metallic layer in the first trench and under the first doped semiconductor layer, and the gate dielectric is also between the metallic layer and the substrate.

9. The device structure of claim 8, wherein the metallic layer comprises titanium nitride (TiN) or tantalum nitride (TaN).

10. The device structure of claim 7, wherein the first conductivity type is p-type and the second conductivity type is n-type.

11. The device structure of claim 7, wherein the first conductivity type is n-type and the second conductivity type is p-type.

12. The device structure of claim 7, wherein the first doped semiconductor layer in the isolation structure comprises doped poly-Si.

13. The device structure of claim 7, further comprising a second vertical transistor at a second side of the isolation structure opposite to the first side of the isolation structure.

14. The device structure of claim 7, which is a memory structure.

15. The device structure of claim 14, wherein the memory structure is a DRAM structure and further comprises a capacitor coupled to the second S/D region.

16. The device structure of claim 15, wherein the first S/D region contacts a buried bit line in a second trench in the substrate.

17. The device structure of claim 16, wherein two buried bit lines are disposed in parallel in the second trench.

18. The device structure of claim 16, wherein the buried bit line comprises a metallic layer and a second doped semiconductor layer having the second conductivity type thereon, and the second doped semiconductor layer contacts the first S/D region.

19. The device structure of claim 18, wherein the first S/D region is formed through dopant diffusion from the second doped semiconductor layer.

* * * * *